United States Patent
Hermann et al.

(10) Patent No.: US 10,215,811 B2
(45) Date of Patent: Feb. 26, 2019

(54) ELECTRONIC CIRCUIT FOR MEASURING CURRENTS DURING CHARGING AND DISCHARGING OF A SECONDARY BATTERY

(71) Applicant: Braun GmbH, Kronberg (DE)

(72) Inventors: Ferdinand Hermann, Koenigstein (DE); Torsten Klemm, Eschborn (DE)

(73) Assignee: Braun GMBH, Kronberg (DE)

( * ) Notice: Subject to any disclaimer, the term of this patent is extended or adjusted under 35 U.S.C. 154(b) by 88 days.

(21) Appl. No.: 15/397,866

(22) Filed: Jan. 4, 2017

(65) Prior Publication Data

US 2017/0199244 A1    Jul. 13, 2017

(30) Foreign Application Priority Data

Jan. 7, 2016   (EP) ..................................... 16150388
Nov. 25, 2016  (EP) ..................................... 16200738

(51) Int. Cl.
   *G01R 31/36*   (2006.01)
   *G01R 19/00*   (2006.01)
   *H02J 7/00*    (2006.01)

(52) U.S. Cl.
   CPC ......... *G01R 31/3624* (2013.01); *G01R 19/00* (2013.01); *G01R 31/3696* (2013.01);
   (Continued)

(58) Field of Classification Search
   CPC ............. G01R 31/3624; G01R 31/3696; H02J 7/0068; H02J 7/0045
   See application file for complete search history.

(56) References Cited

U.S. PATENT DOCUMENTS 5,739,667 A  *  4/1998  Matsuda ............... H02J 7/0072
                                              320/128
8,174,240 B2    3/2012  Yun et al.
                    (Continued)

FOREIGN PATENT DOCUMENTS

JP          2012090472          5/2012

OTHER PUBLICATIONS

European search report dated Jun. 29, 2016.
European search report dated May 16, 2017.

*Primary Examiner* — Tung X Nguyen
*Assistant Examiner* — Dominic Hawkins
(74) *Attorney, Agent, or Firm* — Ronald T. Sia; Kevin C. Johnson

(57) ABSTRACT

An electronic circuit and method for measuring currents during charging and discharging of a secondary battery are disclosed having a secondary battery, at least one shunt for determining the electrical current during charging and/or discharging of the secondary battery by measuring the voltage drop over the shunt, a switchable electrical load, two connectors for connecting a preferably switchable power supply to the electronic circuit for charging the secondary battery and a voltage measuring device. A first shunt is connected in series between the electrical load and the secondary battery, and a second shunt is connected in series between one of the two connectors for connecting the power supply and the secondary battery, wherein the first shunt and the second shunt are connected to the same one of the two battery terminals of the secondary battery, and in that the voltage measuring device comprises only one voltage tapping connected to the electrical conduit between the first shunt and the switchable electrical load and measuring the electrical potential with respect to ground, as defined by the ground potential of the voltage measuring device.

6 Claims, 3 Drawing Sheets

(52) U.S. Cl.
CPC .......... *H02J 7/0045* (2013.01); *H02J 7/0047* (2013.01); *H02J 7/0068* (2013.01)

(56) References Cited

U.S. PATENT DOCUMENTS

| | | | |
|---|---|---|---|
| 8,552,686 B2* | 10/2013 | Jung | H01M 10/44 180/65.1 |
| 8,568,912 B2* | 10/2013 | Whitehead | H01M 8/188 320/103 |
| 8,796,998 B2 | 8/2014 | Wolf et al. | |
| 9,024,583 B2* | 5/2015 | Yang | H01M 10/441 320/112 |
| 9,812,743 B2* | 11/2017 | Koike | H01M 10/44 |
| 2007/0190369 A1* | 8/2007 | Leach | H02J 7/0018 429/9 |
| 2009/0009134 A1* | 1/2009 | Wong | G01R 31/3662 320/134 |
| 2009/0033292 A1* | 2/2009 | Majima | G01R 31/3624 320/153 |

* cited by examiner

ELECTRONIC CIRCUIT FOR MEASURING CURRENTS DURING CHARGING AND DISCHARGING OF A SECONDARY BATTERY

FIELD OF THE INVENTION

The invention relates to an electronic circuit according to the preamble of claim 1 for measuring currents during charging and discharging of a secondary battery, the currents flowing in opposed directions through the secondary battery when charging or discharging, respectively (opposed currents). The electric circuit has at least one shunt for determining the electrical current during charging and/or discharging of the battery by measuring the voltage drop over the shunt, a switchable electrical load, two connectors for connecting a preferably switchable power supply to the electronic circuit for charging the secondary battery and a voltage measuring device. A shunt is an electrical resistor used for measuring the electrical current, preferably with a low electrical resistance. The current flowing through a shunt causes a voltage drop over it proportional to the electrical current. This voltage drop is measured with the voltage measuring device. The invention further relates to a method for measuring the charging and discharging current of a secondary battery with the electrical circuit described before. Preferably, the electronic circuit is integrated into a razor or shaver, in particular an electric razor or shaver, an epilating device, such as an electric epilator, or an oral care device, such as an electric tooth brush, all these devices having typically secondary batteries.

BACKGROUND OF THE INVENTION

In battery powered devices, the direction of the electrical current during charging is inverse with respect to the direction during use of the device, when the load is switched on. During use, typically a switchable electrical load, like a motor or similar is switched on. For several reasons, it is important that both the electrical charging and discharging current are measured with high accuracy. Firstly, knowledge of the charging and discharging current of the secondary battery might be required to determine its charge level by Coulomb counting or detecting the end of charging. Additionally, if the electrical load is a motor, the value of the motor current which is to some extend identical to the discharging current might be used for a rotation speed control or overload. Typically, the control of the electrical load and the measurements are performed by a microcontroller within the device.

For measuring electrical currents in both directions (also denoted as opposed currents in the application), several possibilities are known. The first solution comprises a shunt and an analog-digital converter (ADC) with differential channels typically incorporated into a microcontroller.

Such an ADC having differential channels can measure voltages of both polarities between two input pins of the ADC. The shunt resistor is placed for example at any of the two terminals of the secondary battery and the input pins of the ADC are each connected to one end of the shunt. In such an electronic circuit, the charging current and discharging current both have to pass the shunt resulting in a voltage drop over it. This voltage drop has inverse polarity for charging and discharging, making a differential ADC necessary, which can pick up voltages of both polarities. However, microcontrollers with differential ADCs are more expensive than single-ended ADCs, and an electronic circuit using it occupies two pins of the microcontroller.

A respective electronic circuit is described in US 2007/0190396 A1 having two shunt resistors for measuring the charging and discharging currents, respectively, flowing in opposed directions through the secondary battery using an ADC with differential channels measuring the voltage difference over the one or the other shunt resistor, depending on the direction of the opposed currents during charging and discharging.

Another electronic circuit for such a task uses operational amplifiers to circumvent the problem of negative voltages. But not only that an operational amplifier is a very expensive part, it also has to be calibrated during manufacture, resulting in even higher costs and making it unsuitable for the use in cheap mass products.

An alternative electronic circuit uses two single-ended ADCs or one single ended ADC with two input pins, that can be used equivalent to two single-ended ADCs. Such a circuit further comprises two shunts, one for charging and one for the discharging through the motor or load. One of the shunts, the battery shunt is placed in series to the battery and the first ADC is connected to the side of the shunt that has a positive voltage during charging. The other shunt, the motor or load shunt is placed in series to the motor or load and the second ADC is connected to that end of the shunt that has a positive voltage during use of the device. This electronic circuit has the disadvantage that it uses two microcontroller pins. Additionally, during use of the device, when the motor or similar load is running, the electrical current has to pass both shunts, resulting in a doubling of the power dissipation due to the measuring circuit.

It is therefore an object of the present invention to provide an electronic circuit for efficiently measuring the current in both directions without the above mentioned disadvantages.

SUMMARY OF THE INVENTION

The object is solved with an electronic circuit according to claim 1 and the method according to claim 6.

The proposed electronic circuit has a secondary battery for powering the device, when an external energy source is not connected, which can be recharged after and/or before use of the device. The circuit further comprises at least a first and a second shunt for determining the electrical current during charging and discharging of the battery. The shunt can be an electrical resistor, preferably with a low electrical resistance.

The current flowing through the shunt causes a voltage drop over the shunt proportional to the electrical current. This voltage drop can then be measured to determine the current through the shunt. The electronic circuit further comprises a switchable electrical load, such as an electrical motor or a plurality of similar devices and switching means to activate/deactivate the electrical load.

For charging of the secondary battery, the electronic circuit has two connectors for connecting a power supply to the electronic circuit. The circuit also has a device for measuring the voltage. This can be an analog-digital converter (ADC) which can be part of a microcontroller. This microcontroller might also be used to further control the device. Such an ADC typically has very high input resistance, resulting in an extremely low measuring current. Any other type of voltage measuring device is also possible in line with the proposal, like for example a simple moving coil galvanometer. The first shunt is connected in series between the electrical load and the secondary battery, such that the current through the first shunt is equal to the current through the electrical load. The second shunt is connected in series between one of the two connectors for connecting the power supply and the secondary battery such that the current through the second shunt is equal to the current delivered by the power supply during charging. The first and the second shunt are both connected to the same one pole of the battery terminals. Accordingly, these terminals of the shunts are also connected to each other.

The voltage measuring device only has one voltage tapping adapted and used for measuring the opposed currents during charging and discharging of a secondary battery. To this aim, the one voltage tapping is connected to the electrical conduit between the first shunt and the switchable electrical load. The voltage measuring device therefore measures the electrical potential with respect to a reference potential. This reference potential is ground, as defined by the ground potential of the voltage measuring device, for example the ground connector of the voltage measuring device or of the microcontroller, which is containing the ADC. The ground connector of the voltage measuring device can be internally connected to the connector for connecting the power supply to which also the second shunt is connected. To close the electronic circuit, the other one of the two battery terminals, which is the one not connected to the two shunts, is connected to the switchable load and to the other one of the two connectors for connecting the power supply. Thus, the switchable load is also connected in series between the two battery terminals.

Thus, with the proposal according to the invention, the voltage measuring device is connected such to the electronic circuit that the voltage measured over the first and the second shunt, respectively, has the same polarity for both, charging and discharging currents, i.e. the both opposed currents. This feature allows to use only one single-ended ADC, i.e. an ADC having one tapping, measuring the tapped voltage with respect to a defined reference potential (ground).

The proposal is directed in particular to an electric razor or epilator or an electric tooth brush. These are common user household appliances with limited space for electronic components and secondary batteries with different current directions during use and charging (opposed currents), respectively. The proposal allows for a measurement of both currents (in opposed directions) with one single and low cost microcontroller or the like measuring device requiring only one (non-differential) ADU-channel.

In a preferred embodiment of the proposal, the first shunt and the second shunt are connected to the negative pole of the battery. This results in a positive electrical potential at the tapping of the voltage measuring device. Thereby, voltage measuring devices may be used that are only able to measure positive voltages.

In another preferred embodiment, the connector for connecting the power supply connected to the second shunt is connectable or connected to the negative pole of the power supply. Further, the power supply for charging the secondary battery might be switchable, meaning it can be switched on and off. This can be performed by an integrated control unit, such as a microcontroller.

In another preferred embodiment, the electronic circuit may comprise a control unit adapted to switch off the switchable load during charging. When the power source is integrated into the circuit with for example a fixed connection, the control unit can also be adapted to switch off the charging by switching off the power source while the load is switched on. Thus, no current flows through the first shunt during charging but only through the second shunt. During discharging, no current flows through the second shunt but through the first shunt.

In a preferred embodiment, the voltage measuring device is a single-ended analog-digital converter (ADC). Such an ADC can be part of a generic microcontroller, and be integrated into the microcontroller using only one pin of the microcontroller. The ADC is then measuring against a predetermined reference voltage.

The invention also relates to a method for measuring the charging and discharging current of a battery with any of the above described inventive electronic circuits.

During charging, no current is flowing through the electrical load and thereby through the first shunt. Thus, there is no voltage drop at the first shunt, resulting in the same electrical potential at the first end of this first shunt and the second end of this first shunt. Therefore, the voltage measuring device measures the voltage drop over the second shunt only. The voltage drop of the second shunt is proportional to the charging current that flows through the second shunt between power supply and battery. Both voltage drops are measured with the same single voltage tapping of the electric circuit and show the same polarity.

During use of the electrical load, i.e. when the switchable electrical load is switched on, no current is delivered by the power supply. The power supply might be not connected through the connectors or be deactivated such that no current flows through the second shunt. The current is then flowing only through the first shunt connecting the battery and the electrical switchable load. Thus, the voltage measuring device measures the voltage drop of the first shunt only.

In line with the proposal, the device is either used or recharged, not both at the same time. This means that the supply current is equal to the charging current, and the electrical load current is equal to the discharging current. Since the resistances of the shunts are known, it is possible to calculate the current from the voltage drops according to Ohm's law, as generally known to the one skilled in the art.

In a preferred embodiment, the measured values for the charging and/or discharging current might be used to determine the battery status by Coulomb counting, detect the end of charging or for other reasons. In another preferred embodiment, the electrical load might be an electrical motor and the measured discharging current is used to control the rotation speed of the motor or for an overload detection.

DETAILED DESCRIPTION OF THE INVENTION

Figure 1:
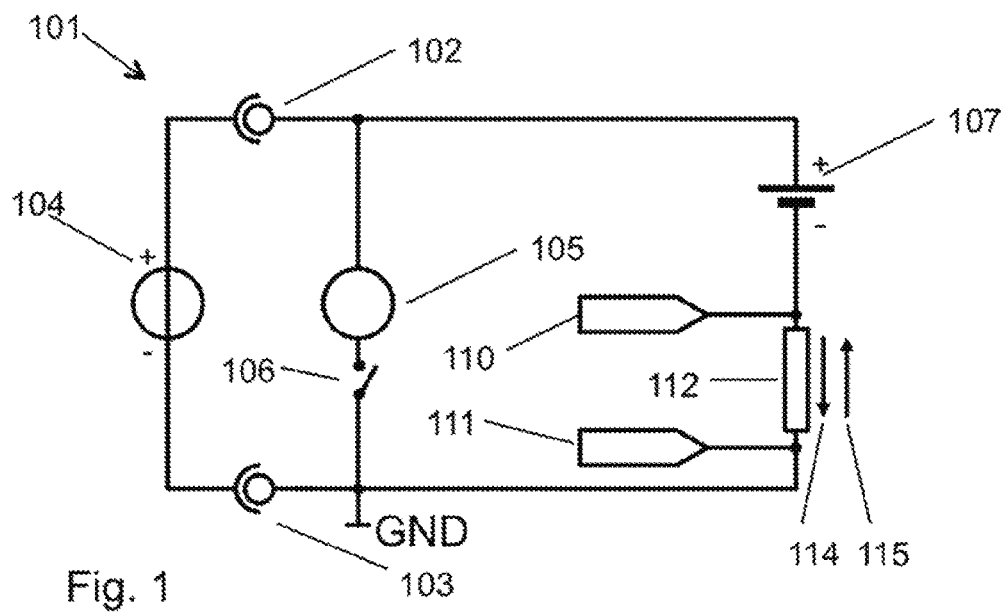
FIG. 1 shows an example for a known electronic circuit for measuring the charging and discharging current with a differential ADC.

FIG. 1 shows a known electronic circuit 101 of a battery powered, reloadable device. The electronic circuit 101 has a secondary battery 107, a switchable electrical load in the form of a motor 105 with a switch 106, a shunt resistor 112 and connectors 102, 103 for connecting a power supply 104. For measuring the electrical current 114, 115 during charging and discharging of the secondary battery 107, the shunt resistor 112 is connected in series to the battery 107 at its negative pole. For measuring the electrical current 114, 115 during charging and discharging of its secondary battery 107, the electronic circuit 101 comprises an analog digital converter (ADC) with differential channels or voltage tappings 110, 111. This means the ADC has two pins 110, 111 and converts the difference in the electrical potential, namely the electrical voltage, between these two points into a digital value. With such an ADC 110, 111 it is possible to measure voltages of both polarities. The first ADC pin 110 is connected to a first end of the shunt 112 and the second ADC pin 111 is connected to the second end of the shunt 112.

When the power supply 104 is not connected, and the switch 106 is in an on-state such that the motor 105 is running, the electrical current through the motor 105 is equal to that through the shunt 112 and also to the discharging current 115 of the battery 107. The direction of the electrical current is directed from the positive pole of the battery 107, through the electrical load 105, through the shunt 112 to the negative pole of the battery 107. Therefore, the electrical current through the shunt 112 runs from the second end of the shunt 112, connected to the second ADC pin 111 to the first end of the shunt 112, connected to the first ADC pin 110. This results in a voltage drop over the shunt 112 with negative voltage at the first ADC pin 110 with respect to the second ADC pin 111.

When the motor 105 is switched off using the switch 106 and the power supply 104 is connected, the battery 107 is charged by the power supply 104 with a charging current 114. The charging current 114 has the opposite direction as the discharging current 115. It is accordingly also flowing through the shunt 112 in the opposite direction. This results in a voltage drop over the shunt 112 with a positive voltage at the first ADC pin 110 with respect to the second ADC pin 111.

The ADC with differential channels 110, 111 can pick up negative and positive voltages and convert them into a digital value. This digital value can then be interpreted by e.g. a processor to calculate the charging current and the motor/discharging current.

Figure 2:
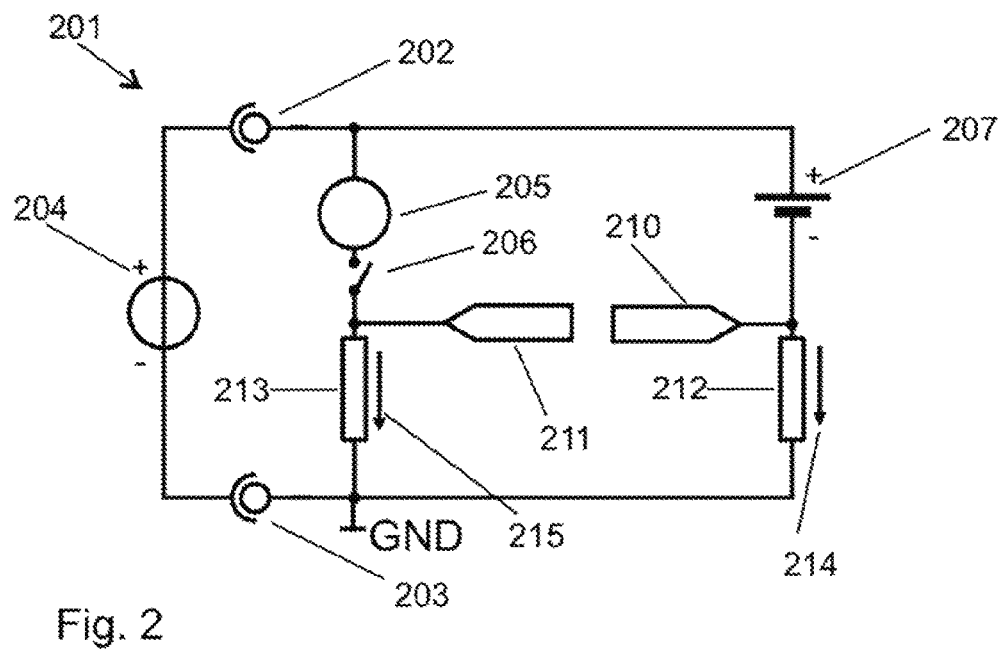
FIG. 2 shows an example for a known electronic circuit for measuring the charging and discharging current with two ADCs.

FIG. 2 shows another known electronic circuit 201 of a battery powered, reloadable device. For measuring the electrical current 214, 215 during charging of its battery 207 and using the motor 205, it comprises two single-ended ADCs 210, 211 and two shunts 212, 213. The battery shunt 212 is connected to the negative pole of the battery 207 together with the first ADC 210. This shunt 212 and ADC 210 are used for determining the electrical current 214 during charging. The motor shunt 213 is connected via the switch 206 to the negative voltage input of the motor 205 together with the second ADC 211. This shunt 213 and ADC 211 are used for determining the electrical current 215 when the motor is used.

When the power supply 204 is not connected, and the switch 206 is turned on, such that the motor 205 is running, the current through the motor 205 is the same as through the shunts 212, 213 and the discharging current 215 of the battery 207. The direction of the electrical current is from the positive pole of the battery 207, through the motor 205 with switch 206, the motor shunt 213, and the battery shunt 212 to the negative pole of the battery 207. Therefore, the electrical current through the battery shunt 212 flows from the second end of the shunt 212, connected to the motor shunt 213 to the first end of the shunt 212, connected to the first ADC 210. This results in a voltage drop over the battery shunt 212 with a negative voltage at the first ADC 210. This voltage can therefore not be measured with the single-ended ADC 210. The electrical current 215 through the motor shunt 213 flows from a first end, connected to the motor 205 with switch 206 to the second end connected to the battery shunt 212. This results in a voltage drop over the motor shunt 213 with a positive voltage at the second ADC 211. Hence, it is possible to measure the discharging current 215 with the second single-ended ADC 211. The discharging/motor current 215 has to flow through both shunts during use of the motor 205.

When the motor 205 is switched off with the switch 206 and the power supply 204 is connected, the battery 207 is charged by the power supply 204 with charging current 214. The charging current 214 has the opposite direction through the battery shunt 212 as the discharging current. This results in a voltage drop over the battery shunt 212 with a positive voltage at the first ADC 210. The charging current 214 can therefore be measured with the first ADC 210.

Figure 3:
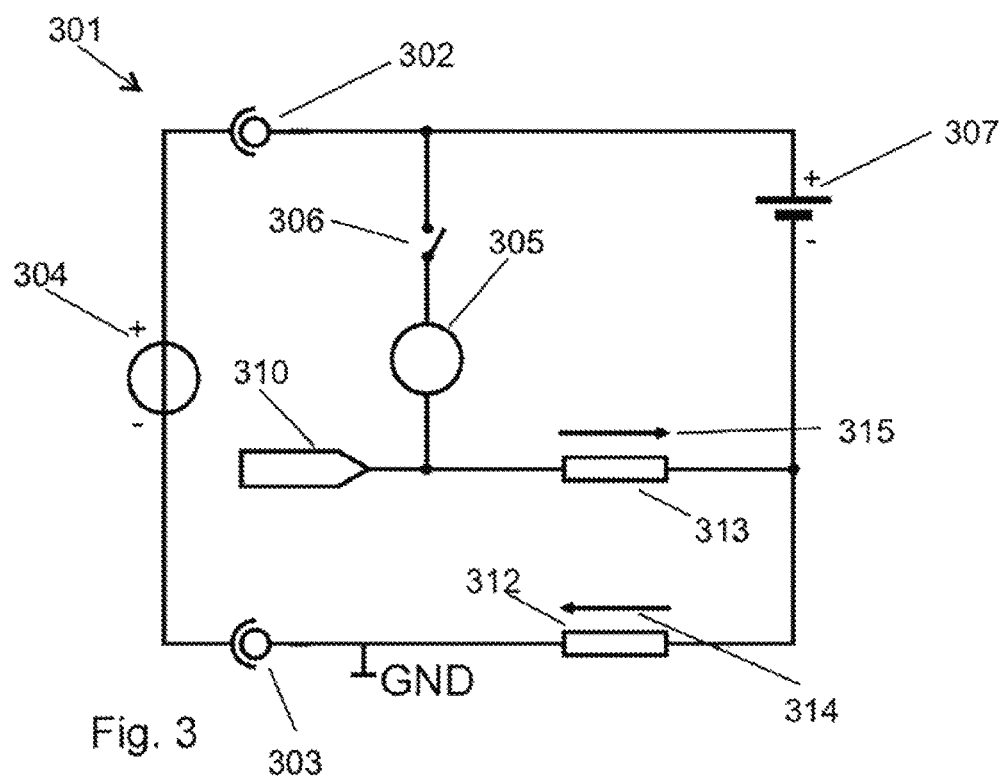
FIG. 3 shows an example for an electronic circuit for measuring the charging and discharging current with a single-ended ADC according to the proposal.

FIG. 3 shows an electronic circuit 301 for a battery powered, reloadable device according to a preferred embodiment of a proposal according to the invention. The circuit comprises two connectors 302, 303 for a power supply 304, a motor 305 with a switch 306, a secondary battery 307, a single-ended ADC as voltage tapping (of voltage measuring device 310), a second or battery shunt 312 and a first or motor shunt 313. In the following, the (single-ended) ADC is also denoted with the reference numeral 310 as it is the only part of the measurement device denoted in FIG. 3.

The positive pole of the battery 307 is connected to a first power supply connector 302, which can be connected to a positive pole of the power supply 304. It is further connected to a positive input of the motor 305 via the switch 306. The negative pole of the battery 307 is connected to a negative input of the motor 305 via the motor shunt 313. It is further connected to the second power supply connector 303 via the battery shunt 312, which can be connected to a negative pole of the power supply 304. The pin of the single-ended ADC 310 is connected to the conduit between the negative input of the motor 305 and the motor shunt 313. This pin of the single-ended ADC 310 is accordingly one voltage tapping for measuring both opposed currents during charging and discharging of a secondary battery 307. Preferably, the connector 303 is connected to the ground level GND. Thus, the ground level GND is the reference potential for the voltage measuring device 310 (voltage tapping).

The power supply 304 might be a switchable power supply 304 in the sense that it can be switched off and on using a suited switching element not shown in the drawings. By switching off and on the power supply, e.g. charging of the secondary battery can be controlled.

Figure 4:
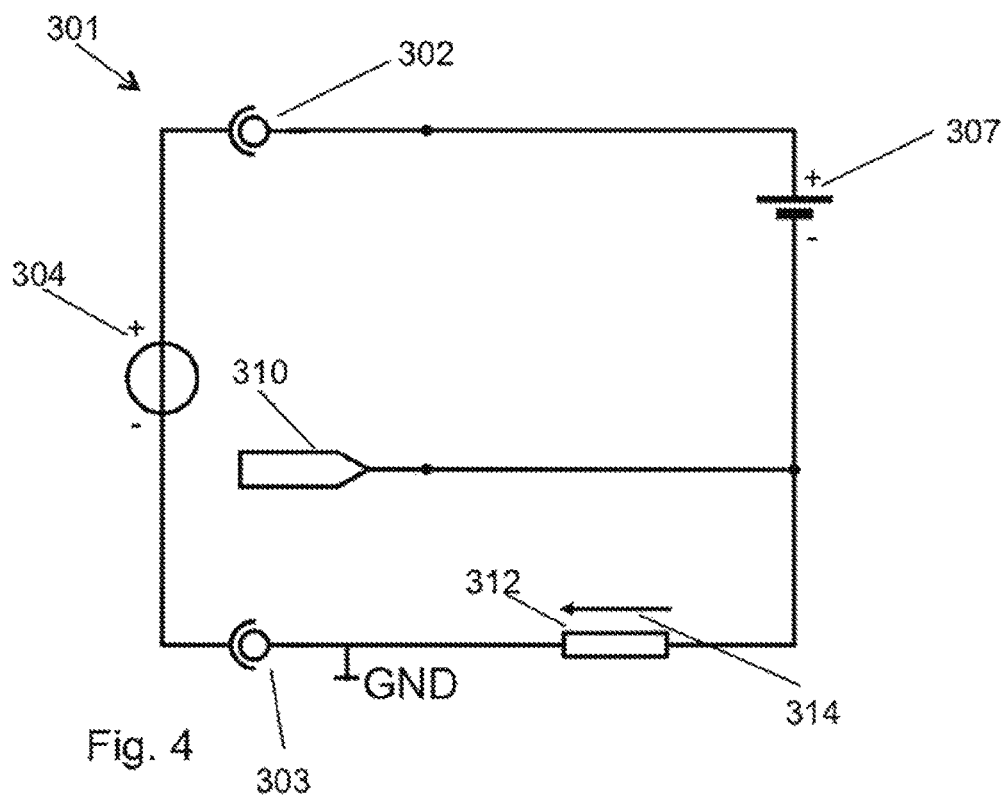
FIG. 4 shows the circuit diagram of FIG. 3 during charging.

FIG. 4 shows the equivalent circuit diagram of the electronic circuit 301 of FIG. 3, when the switch 306 is not closed, and the power supply 304 is connected. Since in that state, no electrical current can flow through the motor 305, these components are omitted in the drawing of the equivalent circuit 301 of FIG. 4 for clarity reasons. The ADC 310, like any typical ADC of a microcontroller, has a very high input resistance of several MΩ, resulting in a very small input current. Therefore, the voltage drop over the motor shunt 313 is negligible and it can also be omitted in the drawing of the equivalent circuit 301.

During charging, the power supply 304 is therefore connected with its positive pole to the positive pole of the battery 307 and its negative pole to the negative pole of the battery 307 via the battery shunt 312. The ADC 310 is connected between the battery shunt 312 and the negative pole of the battery 307. The electrical current flows from the positive pole of the power supply 304 to the positive pole of the battery 307 and from the negative pole of the battery 307 via the battery shunt 312 to the negative pole of the power supply 304, resulting in a voltage drop over the battery shunt 312 with a positive voltage at the ADC 310.

Figure 5:
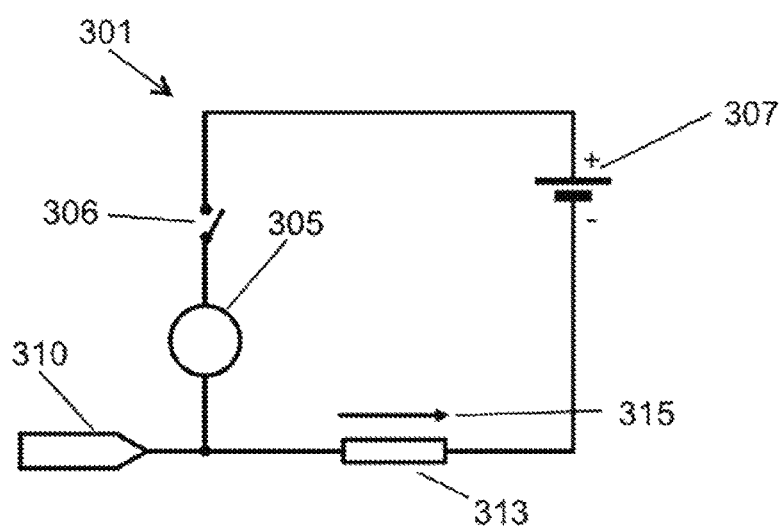
FIG. 5 shows the circuit diagram of FIG. 3 during use of the motor.

FIG. 5 shows the equivalent circuit diagram of the electrical circuit 301 of FIG. 3, when the power supply 304 is not connected and the switch 306 is closed such that the motor 305 is running Since no current flows through the battery shunt 312 and the power supply connectors 302, 303, these components are omitted in the drawing of equivalent circuit diagram.

During use of the motor 305, the positive pole of the battery 307 is therefore connected to the positive input of the motor 305 via the switch 306 and the negative pole of the battery 307 is connected to the negative input of the motor 305 via the motor shunt 313. The ADC 310 is connected between the motor shunt 313 and the motor 305. The current flows from the positive pole of the battery 307 through the motor 305 with switch 306 and the motor shunt 313 to the negative pole of the battery 307. This results in a voltage drop over the motor shunt 313 with a positive voltage at the ADC 310.

Therefore, both during charging and discharging, the voltage at the ADC 310 input (or voltage tapping) is positive, making it possible to be picked up by the single-ended ADC 310.

The dimensions and values disclosed herein are not to be understood as being strictly limited to the exact numerical values recited. Instead, unless otherwise specified, each such dimension is intended to mean both the recited value and a functionally equivalent range surrounding that value. For example, a dimension disclosed as "40 mm" is intended to mean "about 40 mm."

Every document cited herein, including any cross referenced or related patent or application and any patent application or patent to which this application claims priority or benefit thereof, is hereby incorporated herein by reference in its entirety unless expressly excluded or otherwise limited. The citation of any document is not an admission that it is prior art with respect to any invention disclosed or claimed herein or that it alone, or in any combination with any other reference or references, teaches, suggests or discloses any such invention. Further, to the extent that any meaning or definition of a term in this document conflicts with any meaning or definition of the same term in a document incorporated by reference, the meaning or definition assigned to that term in this document shall govern.

While particular embodiments of the present invention have been illustrated and described, it would be obvious to those skilled in the art that various other changes and modifications can be made without departing from the spirit and scope of the invention. It is therefore intended to cover in the appended claims all such changes and modifications that are within the scope of this invention.

What is claimed is:

1. An electronic circuit for measuring currents during charging and discharging of a secondary battery having:
   the secondary battery,
   a first shunt for determining a first electrical current during discharging of the secondary battery,
   a second shunt for determining a second electrical current during charging of the secondary battery,
   a switchable electrical load,
   two connectors for connecting a switchable power supply to the electronic circuit for charging the secondary battery and
   a voltage measuring device,
   wherein
   the first shunt is connected in series between the switchable electrical load and the secondary battery and
   the second shunt is connected in series between one of the two connectors for connecting the switchable power supply and the secondary battery,
   wherein the first shunt and the second shunt are connected to the same one of the two battery terminals of the secondary battery, and
   wherein the voltage measuring device comprises only one voltage tapping configured to measure a first voltage drop over the first shunt when the secondary battery is discharging and configured to measure a second voltage drop over the second shunt when the secondary battery is charging, the one voltage tapping connected to an electrical conduit between the first shunt and the switchable electrical load and measuring the electrical potential with respect to ground, as defined by the ground potential of the voltage measuring device.

2. The electronic circuit according to claim 1, wherein the first shunt and the second shunt are connected to the battery terminal of the negative pole of the secondary battery.

3. The electronic circuit according to claim 1, wherein the one of the two connectors for connecting the switchable power supply being connected to the second shunt is connectable to the negative pole of the switchable power supply.

4. The electronic circuit according to claim 1, having a control unit adapted to switch off the switchable electrical load during charging.

5. The electronic circuit according to claim 1, wherein the voltage measuring device is a single-ended analog digital converter.

6. Method for measuring the charging and discharging current of a secondary battery with the electronic circuit according to claim 1, wherein
   during charging, no current flows through the switchable electrical load such that the voltage measuring device measures with the one voltage tapping the second voltage drop over the second shunt only and
   during use of the switchable electrical load no current is delivered by the switchable power supply such that the voltage measuring device measures with the one voltage tapping the first voltage drop over the first shunt only,
   wherein the first voltage drop over the first shunt and the second voltage drop over the second shunt show the same polarity.

* * * * *